United States Patent
Lee et al.

(10) Patent No.: US 10,556,191 B2
(45) Date of Patent: Feb. 11, 2020

(54) DISTILLATION METHOD

(71) Applicant: LG CHEM, LTD., Seoul (KR)

(72) Inventors: Si Nae Lee, Daejeon (KR); Sung Kyu Lee, Daejeon (KR); Sang Beom Lee, Daejeon (KR); Sung Ho Lee, Daejeon (KR); Jeong Seok Kim, Daejeon (KR); Joon Ho Shin, Daejeon (KR); Dae Chul Jung, Daejeon (KR); Yong Hee Jang, Daejeon (KR); Tae Moon Park, Daejeon (KR); Hyun Jik Yi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 142 days.

(21) Appl. No.: 15/563,772

(22) PCT Filed: Apr. 1, 2016

(86) PCT No.: PCT/KR2016/003387
§ 371 (c)(1),
(2) Date: Feb. 13, 2018

(87) PCT Pub. No.: WO2016/159707
PCT Pub. Date: Oct. 6, 2016

(65) Prior Publication Data
US 2018/0178141 A1      Jun. 28, 2018

(30) Foreign Application Priority Data
Apr. 3, 2015   (KR) .......................... 10-2015-0047681

(51) Int. Cl.
*B01D 3/14*       (2006.01)
*B01D 3/32*       (2006.01)
(Continued)

(52) U.S. Cl.
CPC ............... *B01D 3/141* (2013.01); *B01D 3/32* (2013.01); *B01D 3/4261* (2013.01);
(Continued)

(58) Field of Classification Search
CPC ........ B01D 3/141; B01D 3/32; B01D 3/4261; G03F 7/425
See application file for complete search history.

(56) References Cited

U.S. PATENT DOCUMENTS

| | | | |
|---|---|---|---|
| 4,230,533 A * | 10/1980 | Giroux ...................... | B01D 3/14 196/132 |
| 5,785,819 A * | 7/1998 | Kaibel ...................... | B01D 3/14 202/158 |
| 2014/0238840 A1 | 8/2014 | Lee et al. | |

FOREIGN PATENT DOCUMENTS

CN   102281931 A   12/2011
JP   2010501124 A   1/2010
(Continued)

OTHER PUBLICATIONS

Office Action of Chinese Patent Office in Appl'n No. 2016800209245, dated Jan. 21, 2019.

*Primary Examiner* — Jonathan Miller
(74) *Attorney, Agent, or Firm* — Dentons US LLP (57) ABSTRACT

By using the distillation device of the present application, energy loss occurring in a purification process of a solution including a waste stripper and a stripped photoresist resin used in a stripping process of a photoresist can be minimized and the installation cost of the distillation device can be reduced compared to the case in which dual distillation columns are used, thereby increasing the economic feasibility of a process.

15 Claims, 2 Drawing Sheets

(51) Int. Cl.
*B01D 3/42* (2006.01)
*B01D 5/00* (2006.01)
*G03F 7/42* (2006.01)
*H01L 27/12* (2006.01)

(52) U.S. Cl.
CPC .......... *B01D 5/0063* (2013.01); *G03F 7/425* (2013.01); *H01L 27/1288* (2013.01)

(56) References Cited

FOREIGN PATENT DOCUMENTS

| | | |
|---|---|---|
| JP | 2012517342 A | 8/2012 |
| KR | 10-2008-0099034 A | 11/2008 |
| KR | 10-1330653 B1 | 11/2013 |
| KR | 10-2014-0092785 A | 7/2014 |
| KR | 10-2015-0010663 A | 1/2015 |
| KR | 10-2015-0016137 A | 2/2015 |
| WO | 2014112808 A1 | 7/2014 |

* cited by examiner

DISTILLATION METHOD

TECHNICAL FIELD

The present application relates to a distillation device and method.

BACKGROUND ART

This application is a National Stage Entry of International Application No. PCT/KR2016/003387 filed on Apr. 1, 2016, and claims the benefit of Korean Application No. 10-2015-0047681, filed Apr. 3, 2015, all of which are hereby incorporated by reference in their entirety for all purposes as if fully set forth herein.

As IT and semiconductor industries have greatly developed in recent years, the production quantities of related products, such as TFT-LCD, have been increasing. Accordingly, the amount of waste emitted from manufacturing processes is also rapidly increasing. In particular, in manufacturing processes of TFT-LCD array circuit boards, a photoresist stripping solution (hereinafter referred to as "stripper") is used to remove a photoresist, particulate residues, debris, and denatured materials which remain after gate pattern formation and metal film etching in a stripping process of a photoresist. The amount of an organic solvent used in the stripper has reached about 30,000 tons each year and the cost of the organic solvent is highest among the costs of raw materials. Accordingly, a need for recycling of waste stripper solutions is increasing.

For example, since waste stripper solutions used in the manufacturing processes include impurities, such as photoresist resins, moisture, heavy metals, etc., in addition to organic amine compounds and organic solvents, a process of separating organic solvents and photoresist resins from the waste stripper solutions is required. Conventionally, organic solvents and organic amine compounds were collected from the waste stripper solution containing water, organic amine compounds, organic solvents, and stripped photoresist resins using a distillation device in which two distillation columns are sequentially connected. However, during this process, there was a problem of a large amount of energy loss.

Therefore, there is a need for a stripper solution purification process that allows separation of high-purity organic solvents and organic amine compounds while reducing installation cost of a distillation device and energy consumption.

DISCLOSURE

Technical Problem

The present application aims to provide a distillation device for high purity separation of a waste stripper solution used in a stripping process of a photoresist at low cost.

Technical Solution

The present application relates to a distillation device. According to exemplary embodiments of the present application, the distillation device may improve the economic efficiency of a process by minimizing energy loss occurring in a purification process of a waste stripper solution containing a stripper used in a stripping process of a photoresist and a stripped photoresist resin and by high purity separation of products. In addition, the distillation device of the present application provides temperature and pressure conditions, optimized for separating a waste stripper solution using a dividing wall column. Accordingly, the stripper may be separated with high purity and reused when the stripper and the stripped photoresist resin are separated by means of the distillation device of the present application.

Hereinafter, the distillation device of the present application is described with reference to the accompanying drawings. However, it should be understood that the scope of the distillation device is not limited to the accompanying drawings, which are merely provided as exemplary embodiments.

Figure 1:
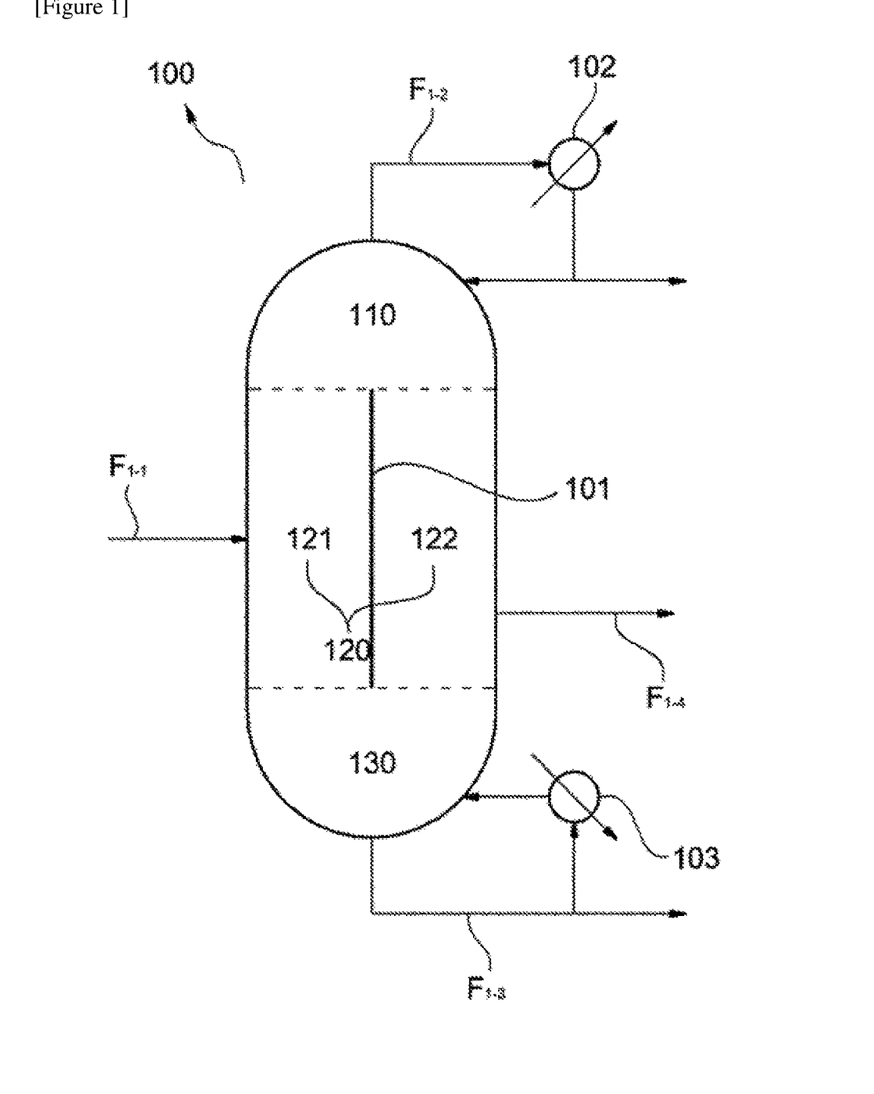
FIG. 1 exemplarily illustrates a distillation device according to embodiments and examples of the present application.

FIG. 1 exemplarily illustrates a distillation device according to an embodiment of the present application.

As illustrated in FIG. 1, the distillation device of the present application includes a distillation column 100 that includes a condenser 102, a reboiler 103, and a dividing wall 101 therein. The distillation column 100 equipped with the dividing wall 101 therein may be a dividing wall column 100. The dividing wall column 100 is a device designed for distillation of a raw material $F_{1-1}$ containing low, middle, or high-boiling-point components, and, in terms of thermodynamics, is a similar to a so called "thermally coupled distillation column (Petlyuk column)." The thermally coupled distillation column is designed so that low boiling point and high boiling point materials are primarily separated in a prefractionator, and then materials at the top and bottom of the prefractionator are respectively fed to a main column, whereby low, middle, and high boiling point materials are respectively separated in the main column. On the other hand, the dividing wall column 100 is a shape wherein the dividing wall 101 is installed within the column and thus a prefractionator is integrated with a main column.

Meanwhile, in the case of the dividing wall column 100, the flow rate of internal circulation cannot be adjusted due to structural characteristics thereof, unlike a Petlyuk distillation column, after the dividing wall column 100 is designed, whereby flexibility for variation of operating conditions is decreased. Accordingly, it is necessary to determine a control structure that is capable of exact simulation and easy control for various disturbances at an early-design stage of the distillation column. Furthermore, in the case of the dividing wall column 100, structural designs and operating conditions, such as a feed plate location, dividing wall section setting, side stream location, the number of theoretical plates, distillation temperature, and distillation pressure, are very limited. In particular, structural designs, such as the number of plates of the distillation column and the locations of a feed plate and a sidedraw plate, and operating conditions, such as distillation temperature, distillation pressure, and reflux ratio, should be particularly changed depending upon the nature of a target compound to be distilled. The present application, as described above, provides the dividing wall column 100, which is suitably designed for high purity separation of a waste stripper solution containing a stripper and a stripped photoresist resin at high efficiency, and a condition of operating the dividing wall column 100, so as to reduce energy required for the purification of a waste stripper and distillation device installation cost.

Specific types of the dividing wall column 100, which may be used in the distillation device of the present application, are not specifically limited. For example, as illustrated in FIG. 1, the dividing wall column 100 with a general structure, or a distillation column in which the location or design of the dividing wall 101 is modified considering purification efficiency, may be used. In addition, the number of plates and a diameter of the distillation column are not specifically limited. For example, the number of plates and the diameter may be set based on the number of theoretical plates, etc. which are inferred from distillation curves considering the composition of a raw material $F_{1-1}$.

In an embodiment, the dividing wall column 100 of the present application may have a structure illustrated in FIG. 1. As illustrated in FIG. 1, the interior of the exemplary dividing wall column 100 may be divided by the dividing wall 101. In addition, the interior of the dividing wall column 100, as divided by dotted lines in FIG. 1, may be divided into a column top zone 110, a column bottom zone 130 and a dividing wall zone 120 that is present between and contacts the column top zone 110 and the column bottom zone 130. Here, the dividing wall 101 may be located in the dividing wall zone 120. Accordingly, the interior of the distillation column 100 may be divided into a zone in which the dividing wall 101 is located, i.e., the dividing wall zone 120, and zones in which the dividing wall 101 is not located, i.e., the column top zone 110 and the column bottom zone 130. In addition, the dividing wall zone 120 may be divided into a feed supply zone 121 and a product sidedraw zone 122, which are separated by the dividing wall 101. For example, the dividing wall column 100 may be divided into the column top zone 110, from which a stream of light components are discharged, the column bottom zone 130, from which a stream of heavy components are discharged, the feed supply zone 121, into which the raw material $F_{1-1}$ is introduced, and the product discharge zone 122, from which a product is discharged. The term "column top zone" of the dividing wall column 100 refers to a top part of the dividing wall column 100, and may be included in the column top zone 110 of the dividing wall column 100 described above. In addition, the term "column bottom zone" of the dividing wall column 100 refers to a bottom part of the dividing wall column 100, and may be included in the column bottom zone 130 of the dividing wall column 100 described above. The "condenser", as a device separately installed from the distillation column, may refer to a device for cooling by contacting materials discharged from the main device with a coolant introduced from the outside. For example, the condenser 102 of the distillation device may be a device for condensing a column overhead stream $F_{1-2}$ discharged from the column top zone 110 of the dividing wall column 100. In addition, the "reboiler," as a heating device installed at the outside of the distillation column, may refer to a device for re-heating and evaporating a stream of high-boiling-point components. For example, the reboiler 103 of the distillation device may be a device for heating the column bottom stream $F_{1-3}$ discharged from the column bottom zone 130 of the dividing wall column 100.

In the dividing wall column 100 of the present application, the feed supply zone 121 and the product discharge zone 122 may be separated or isolated from each other by the presence of the dividing wall 101. Accordingly, the dividing wall 101 may prevent a stream within the feed supply zone 121 from being mixed with a stream within the product discharge zone 122. The term "separation or isolation" used in the present specification refers to a state in which a stream in each of the zones separated by the dividing wall 101 independently flows or exists in each of the zones. In an embodiment, the dividing wall 101 of the dividing wall column 100 may be located at 5 to 95%, 10 to 90%, preferably 15 to 85%, more preferably 20 to 80% of the total number of theoretical plates, which is calculated based on the column top zone of the dividing wall column 100. The term "the number of theoretical plates" refers to the number of hypothetical zones or plates, in which two phases, such as liquid and vapor phases, establish equilibrium, in the dividing wall column 100. When the dividing wall 101 is located in the dividing wall zone 120 of the dividing wall column 100 within the theoretical number of plates ranges, a stream within the feed supply zone 121 may be effectively prevented from being mixed with a stream within the product discharge zone 122. In addition, the dividing wall 101 also prevents a product stream $F_{1-4}$, which is discharged from the product discharge zone 122, from being mixed with light components and discharged.

In an embodiment, a raw material $F_{1-1}$ of a waste stripper solution including a stripper and a stripped photoresist resin, as illustrated in FIG. 1, may be introduced into the feed supply zone 121 of the dividing wall column 100.

For example, when the raw material $F_{1-1}$ of the waste stripper solution is fed to the dividing wall column 100, the raw material $F_{1-1}$ is separated into each of a column bottom stream $F_{1-3}$ discharged from the column bottom zone 130, a column overhead stream $F_{1-2}$ discharged from the column top zone 110, and a product stream $F_{1-4}$ discharged from the product discharge zone 122, followed by being respectively discharged. Among components contained in a waste stripper solution, i.e., the raw material $F_{1-1}$, a component with a relatively low boiling point may be discharged as the column overhead stream $F_{1-2}$ through the column top zone 110 of the dividing wall column 100. Among components contained in a waste stripper solution, i.e., the raw material $F_{1-1}$, a component with a relatively high boiling point may be discharged as the column bottom stream $F_{1-3}$ through the column bottom zone 130 of the dividing wall column 100. Among components contained in waste stripper solution, i.e., the raw material $F_{1-1}$, a component with a relatively middle boiling point may be discharged as the product stream $F_{1-4}$ through the product discharge zone 122 of the dividing wall column 100. The "low-boiling-point stream" refers to a relatively light component-rich stream of the raw material stream $F_{1-1}$ containing low, middle, and high-boiling-point components. For example, the low-boiling-point stream refers to a stream discharged from the column top zone 110 of the dividing wall column 100. The "high-boiling-point stream" refers to a relatively-high-boiling-point component-rich stream of the raw material stream $F_{1-1}$ containing low, middle, and high-boiling-point components. For example, the high-boiling-point stream refers to a relatively-high-boiling-point component-rich stream discharged from the column bottom zone 130 of the dividing wall column 100. The "middle-boiling-point stream" refers to a stream enriched with a component, which has an middle boiling point between low boiling and high boiling points, of the raw material stream $F_{1-1}$ containing low, middle, and high-boiling-point components. For example, the middle-boiling-point stream refers to a stream discharged from the product discharge zone 122 of the dividing wall column 100. The "-rich stream" refers to a stream with a higher amount of $_{light}$ components included in a stream discharged from the column top zone 110, high-boiling-point components included in a stream discharged from the column bottom zone 130, or middle-boiling-point components included in a stream discharged from the product discharge zone 122, of the dividing wall column 100, when compared to the amount of $_{light}$ components, high-boiling-point components, or middle-boiling-point components contained in the raw material $F_{1-1}$. For example, in the -rich stream, the amount of $_{light}$ components included in the column overhead stream $F_{1-2}$, high-boiling-point components included in the column bottom stream $F_{1-3}$, or middle-boiling-point components included in the product stream $F_{1-4}$, of the dividing wall column 100 may be 50% by weight or more, 80% by weight or more, 90% by weight or more, 95% by weight or more, or 99% by weight or more. In the present specification, the meaning of the low-boiling-point stream may be the same as that of the column overhead stream $F_{1-2}$ of the dividing wall column 100, the meaning of the high-boiling-point stream may be the same as that of the column bottom stream $F_{1-3}$ of the dividing wall column 100, and the meaning of the middle-boiling-point stream may be the same as that of the product stream $F_{1-4}$ of the dividing wall column 100.

The stripper contained in the raw material $F_{1-1}$ of the waste stripper solution may be a stripper used in a stripping process of a photoresist. In an embodiment, the stripper may be a non-aqueous stripper or an aqueous stripper. The aqueous stripper refers to a stripper, each component of which is dissolved in water, and the non-aqueous stripper refers to a stripper not containing water. In addition, the waste stripper solution $F_{1-1}$ may include $_{light}$ components such as, for example, water or isopropyl alcohol (IPA), methanol, and diethylamine (DEA); an organic amine compound; an organic solvent; and a non-volatile material generated by heating and decomposition of a photoresist, e.g., a stripped photoresist such as a modified polymer or a metal component.

The organic amine compound is included within a stripper to destroy attractive forces existing within a molecule or between molecules by infiltrating into a polymer structure of a photoresist which is deformed or cross-linked in several processes, such as etching, ashing, and ion implantation, and thus dissolves the photoresist and easily removes the photoresist. In an embodiment, examples of the organic amine include, without being limited to, alkylamines, alkanolamines, tertiary ammonium, tertiary cyclic amines, alkoxyamines, hydroxy methyl amine, etc.

In addition, in an embodiment, examples of the organic amine compound may include one or more compounds selected from a group consisting of primary amino alcohol compounds, secondary amino alcohol compounds, and tertiary amino alcohol compounds. The amino alcohol compound may be one or more selected from the group consisting of monoethanol amine (MEA), 1-aminoisopropanol (AIP), 2-amino-1-propanol, N-methylaminoethanol (N-MAE), 3-amino-1-propanol, 4-amino-1-butanol, 2-(2-aminoethoxy)-1-ethanol (AEE), 2-(2-aminoethylamino)-1-ethanol, triethanol amine (TEA), hydroxyethylpiperazine (HEP), aniline, phenylenediamine (PPD), aminobiphenyl (ABP), 2-aminonaphthalene, 1-amino-2-propanol (AIP2), and 1-imidazoline ethanol, but the present invention is not limited thereto.

The organic solvent may include a protic organic solvent and an aprotic polar solvent.

The protic organic solvent is a compound with low vapor pressure and thus loss of the solvent by heat or evaporation is small. In addition, the protic organic solvent is included in the stripper such that oxide ions, which may be generated from alkali compounds, effectively infiltrate into a space between a photoresist and a glass substrate, and thus, the oxide ions perform dissolution and stripping actions. That is, the protic organic solvent may facilitate the dissolution of a photoresist stripped by an alkali compound.

The protic organic solvent may be a protic glycol ether based organic solvent. The protic glycol ether based organic solvent may be one or more selected from the group consisting of diethylene glycol monoether (DGME), diethylene glycol monobutylether (BDG), diethylene glycol monoethyl ether (EDG), diethylene glycol monomethyl ether (MDG), triethylene glycol (TEG), propylene glycol monoether (PGME), propylene glycol monoether acetate (PGMEA), diethylene glycol (DEG), ethyleneglycol (EG), and mixtures thereof etc., but the present invention is not limited thereto.

The aprotic polar solvent has high solubility with respect to a photoresist and thus, to prevent reattachment of a photoresist, which mainly occurs in a washing process, by dissolving a photoresist stripped by the organic amine compounds, and to maximize a washing effect, is included in the stripper.

Examples of the aprotic polar solvent include one or more of selected from the group consisting of, for example, dimethylsulfoxide (DMSO), N-methyl pyrrolidone (NMP), N,N-dimethylacetamide (DMAc), N,N-dimethylformamide (DMF), N,N-dimethylimidazole, γ-butyrolactone, sulfolane, diethylformamide (DEF), and mixtures thereof. Preferably, the aprotic polar solvent is a mixture of two or more of the listed compounds, but the present invention is not limited thereto.

In addition, the stripper may further include an adjusting agent or an additive to improve the properties of stripper, e.g., to prevent corrosion of TFT lines, to control contact resistance, to enhance stripping ability, etc.

In an embodiment, the stripper may be a non-aqueous stripper. In this case, the waste stripper solution may include the organic amine compound, the organic solvent, and the stripped photoresist. However, since a small or large amount of water may be used also in a general stripping process in which a non-aqueous stripper is used, the waste stripper solution including the non-aqueous stripper may include water. Accordingly, when such a non-aqueous stripper is separated by means of the distillation device of the present application, a particular control condition is required to merely separate a non-aqueous stripper not containing water through the product stream $F_{1-4}$.

In an embodiment, when the stripper is a non-aqueous stripper, the temperature of the column top zone 110 of the dividing wall column 100 may be between a lower temperature and an upper temperature which are calculated according to the following Equations 1 and 2, respectively:

$$P=0.00126 \times T_{top,lower}^3 - 0.07051 \times T_{top,lower}^2 + 3.17767 \times T_{top,lower} - 15.01040 \quad \text{[Equation 1]}$$

$$P=0.00150 \times T_{top,upper}^3 - 0.18493 \times T_{top,upper}^2 + 9.56742 \times T_{top,lower} - 176.07273 \quad \text{[Equation 2]}$$

In Equations 1 and 2, $T_{top,lower}$ represents a lower temperature of the column top zone, $T_{top,upper}$ represent an upper temperature of the column top zone, and P represents the pressure of the column top zone. Here, the pressure is 20 mmHg to 300 mmHg.

When the distillation device of the present application satisfies Equations 1 and 2, the content of water in the product stream $F_{1-4}$ may be controlled to an amount of, for example, 0.001 or less parts by weight based on the total components included in the product stream $F_{1-4}$, such that water is not contained in the product stream $F_{1-4}$. In an embodiment, the content of the water may be controlled to 500 ppm or less, thereby separating a high-purity non-aqueous stripper with superior efficiency. That is, by, in the distillation device, controlling the temperature of the column top zone 110 to within a range of lower and upper temperatures respectively calculated according to Equations 1 and 2, energy saving effects can be maximized As such, when the raw material $F_{1-1}$ of the waste stripper solution including the non-aqueous stripper and the stripped photoresist is separated by means of the distillation device of the present application, the temperature of the column top zone 110 of the dividing wall column 100 is not specifically limited as long as the temperature is included in a range of lower and upper temperatures respectively calculated according to Equations 1 and 2. The temperatures may be 14 to 92° C., e.g., 14 to 47° C., 19 to 51° C., 44 to 70° C., 66 to 87° C., or 70 to 92° C. In addition, the temperature of the column bottom zone 130 of the dividing wall column 100 may be, without being limited to, 100 to 250° C., e.g., 100 to 130° C., 130 to 150° C., 150 to 180° C., 180 to 210° C., or 210 to 250° C.

In addition, the pressure of the column top zone 110 of the dividing wall column 100 may be 20 mmHg to 300 mmHg, e.g., 20 mmHg to 30 mmHg, 30 mmHg to 50 mmHg, 100 mmHg to 120 mmHg, 200 mmHg to 220 mmHg, or 270 mmHg to 300 mmHg, and the pressure of the column bottom zone 130 of the dividing wall column 100 may be 50 mmHg to 400 mmHg, e.g., 50 mmHg to 100 mmHg, 150 mmHg to 180 mmHg, 250 mmHg to 270 mmHg, or 350 mmHg to 400 mmHg, but the present invention is not limited thereto.

In this case, a reflux ratio of the column overhead stream $F_{1-2}$ refluxed into the column top zone 110 of the dividing wall column 100, of the column overhead stream $F_{1-2}$ of the dividing wall column 100, may be 0.01 to 50. From a thermodynamic point of view, the reflux ratio may be preferably 0.05 to 45, 0.1 to 40, or 0.5 to 30. A boilup ratio of the column bottom stream $F_{1-3}$ returned to the column bottom zone 130 of the dividing wall column 100, of the column bottom stream $F_{1-3}$ of the dividing wall column 100, may be 1 to 200. From a thermodynamic point of view, the reflux ratio may be preferably 10 to 180, 20 to 160, or 30 to 150. In the present specification, the term "reflux ratio" and "boilup ratio" refers to a ratio of a reflux(boilup) flow rate to a flow rate discharged from the distillation column 100.

When the waste stripper solution including the non-aqueous stripper is purified by means of the distillation device of the present application according to the aforementioned particular control condition, the column overhead stream $F_{1-2}$ discharged from the column top zone of the distillation column may include water and one or more selected from the group consisting of materials having a boiling point of less than 100° C. at atmospheric pressure, e.g., 1 atm. Examples of a material having a boiling point of less than 100° C. at atmospheric pressure include, for example, methanol, isopropyl alcohol (IPA), diethylamine (DEA), and the like. In this case, the product stream $F_{1-4}$ discharged from the product discharge zone 122 of the distillation column may include a protic organic solvent, an aprotic polar solvent, and an organic amine compound, and the content of water in the product stream $F_{1-4}$ may be controlled to 0.001 parts by weight or less, e.g., 0.0001 parts by weight or less, 0.00001 parts by weight or less or 0.000001 parts by weight or less, based on total components included in the product stream $F_{1-4}$. In an embodiment, the content of water in the product stream $F_{1-4}$ may be controlled to 500 ppm or less, e.g., 100 ppm or less, 10 ppm or less or 1 ppm or less. In addition, the column bottom stream $F_{1-3}$ discharged from the column bottom zone 130 of the distillation column may include the stripped photoresist resin.

In another embodiment, the stripper may be an aqueous stripper. In this case, the waste stripper solution may include water, an organic amine compound, an organic solvent and a stripped photoresist. When the aqueous stripper is separated by means of the distillation device of the present application, a specific control condition is required such that water is included and a material having a boiling point of less than 100° C. at atmospheric pressure is not included in the product stream $F_{1-4}$.

In an embodiment, when the stripper is an aqueous stripper, the temperature of the column top zone 110 of the dividing wall column 100 may be in a range of lower and upper temperatures respectively calculated according to the following Equations 3 and 4:

$$P=0.00177 \times T_{top,lower}^3 - 0.01645 \times T_{top,lower}^2 + 2.13532 \times T_{top,lower} - 12.36272 \quad \text{[Equation 3]}$$

$$P=0.00144 \times T_{top,lower}^3 - 0.10028 \times T_{top,lower}^2 + 4.27752 \times T_{top,lower} - 44.49051 \quad \text{[Equation 4]}$$

In Equations 3 and 4, $T_{top,lower}$ represents a lower temperature of the column top zone, $T_{top,upper}$ represents an upper temperature of the column top zone, and P represents the pressure of the column top zone. Here, the pressure is 20 mmHg to 300 mmHg When the distillation device of the present application satisfies Equations 3 and 4, the content of a material having a boiling point of less than 100° C. at atmospheric pressure in the product stream $F_{1-4}$ may be controlled to an amount of, for example, 0.001 or less parts by weight based on total components included in the product stream $F_{1-4}$, such that water is contained and the material having a boiling point of less than 100° C. at atmospheric pressure is not included in the product stream $F_{1-4}$. In an embodiment, the content of the material having a boiling point of less than 100° C. at atmospheric pressure may be controlled to 500 ppm or less, thereby separating a high-purity aqueous stripper with superior efficiency. That is, by, in the distillation device, controlling the temperature of the column top zone 110 to within a range of lower and upper temperatures respectively calculated according to Equations 3 and 4, energy saving effects can be maximized.

As such, when the raw material $F_{1-1}$ of the waste stripper solution including the aqueous stripper and the stripped photoresist is separated by means of the distillation device of the present application, the temperature of the column top zone 110 of the dividing wall column 100 is not specifically limited so long as the temperature is included in a range of lower and upper temperatures respectively calculated according to Equations 3 and 4. The temperatures may be 4 to 74° C., e.g., 4 to 24° C., 8 to 29° C., 28 to 50° C., 46 to 69° C., or 50 to 74° C. In addition, the temperature of the column bottom zone 130 of the dividing wall column 100 may be, without being limited to, 150 to 300° C., e.g., 150 to 180° C., 180 to 200° C., 210 to 240° C., 250 to 280° C., or 280 to 300° C.

In addition, the pressure of the column top zone 110 of the dividing wall column 100 may be 20 mmHg to 300 mmHg, e.g., 20 mmHg to 30 mmHg, 30 mmHg to 50 mmHg, 100 mmHg to 120 mmHg, 200 mmHg to 220 mmHg, or 270 mmHg to 300 mmHg, and the pressure of the column bottom zone 130 of the dividing wall column 100 may be 50 mmHg to 400 mmHg, e.g., 50 mmHg to 100 mmHg, 150 mmHg to 180 mmHg, 250 mmHg to 270 mmHg, or 350 mmHg to 400 mmHg In this case, a reflux ratio of the column overhead stream $F_{1-2}$ refluxed into the column top zone 110 of the dividing wall column 100, of the column overhead stream $F_{1-2}$ of the dividing wall column 100, may be 1 to 100. From a thermodynamic point of view, the reflux ratio may be preferably 5 to 90, 10 to 80, or 20 to 60. A boilup ratio of the column bottom stream $F_{1-3}$ returned to the column bottom zone 130 of the dividing wall column 100, of the column bottom stream $F_{1-3}$ of the dividing wall column 100, may be 1 to 300. From a thermodynamic point of view, the reflux ratio may be preferably 10 to 280, 30 to 260, or 50 to 250.

When the waste stripper solution including the aqueous stripper is purified by means of the distillation device of the present application according to the aforementioned particular control condition, the column overhead stream $F_{1-2}$ discharged from the column top zone of the distillation column may include one or more selected from the group consisting of materials having a boiling point of less than 100° C. Examples of a material having a boiling point of less than 100° C. at atmospheric pressure include, for example, methanol, isopropyl alcohol (IPA), diethylamine (DEA), and the like. In this case, the product stream $F_{1-4}$ discharged from the product discharge zone 122 of the distillation column may include water, a protic organic solvent, an aprotic polar solvent, and an organic amine compound, and the content of a material having a boiling point having a boiling point of less than 100° C. at atmospheric pressure in the product stream $F_{1-4}$ may be controlled to 0.001 parts by weight or less, e.g., 0.0001 parts by weight or less, 0.00001 parts by weight or less or 0.000005 parts by weight or less, based on total components included in the product stream $F_{1-4}$. In an embodiment, the content of components having a lower boiling point than water in the product stream $F_{1-4}$ may be controlled to 500 ppm or less, e.g., 100 ppm or less, 10 ppm or less or 5 ppm or less. In addition, the column bottom stream $F_{1-3}$ discharged from the column bottom zone 130 of the distillation column may include the stripped photoresist resin.

Hereinafter, a process of separating the raw material $F_{1-1}$ from the waste stripper solution by means of the distillation device of the present application is described in detail.

In an embodiment, to separate the raw material $F_{1-1}$ including components having low, middle, or high boiling points, the raw material $F_{1-1}$ of the waste stripper solution including a non-aqueous stripper and a stripped photoresist may be introduced into the feed supply zone 121 of the dividing wall column 100 as illustrated in FIG. 1. The raw material $F_{1-1}$ introduced into the feed supply zone 121 may be separately discharged as the column bottom stream $F_{1-3}$ including the stripped photoresist resin, the product stream $F_{1-4}$ including the organic amine compound, the protic glycol ether based organic solvent, and the aprotic polar solvent that are included in the non-aqueous stripper, and the column overhead stream $F_{1-2}$ including water and/or a material having a boiling point of less than 100° C. at atmospheric pressure. In an embodiment, the organic amine compound included in the product stream $F_{1-4}$ may be, e.g., 2-(2-aminoethoxy)-1-ethanol (AEE); the protic glycol ether based organic solvent may be, e.g., diethylene glycol monobutylether (BDG); and the aprotic polar solvent may be, e.g., N-methyl pyrrolidone (NMP) and dimethylacetamide (DMAc). In addition, the material having a boiling point of less than 100° C. at atmospheric pressure included in the column overhead stream $F_{1-2}$ may include, for example, methanol.

In an embodiment, when the raw material $F_{1-1}$ of the waste stripper solution including water and/or methanol as $_{light}$ components; 2-(2-aminoethoxy)-1-ethanol (AEE), diethylene glycol monobutylether (BDG), N-methyl pyrrolidone (NMP), and dimethylacetamide (DMAc) as middle-boiling-point components; and a photoresist as a high-boiling-point component is introduced into the feed supply zone 121 of the dividing wall column 100, the column overhead stream $F_{1-2}$ as a stream including relatively $_{light}$ components, e.g., a water and/or methanol-rich stream, among the components of the raw material $F_{1-1}$ may be discharged from the column top zone 110 of the dividing wall column 100. A portion of the discharged column overhead stream $F_{1-2}$ is refluxed into the column top zone 110 of the dividing wall column 100 via the condenser 102 and the remaining portion thereof may be stored as a product. Meanwhile, the column bottom stream $F_{1-3}$ including a relatively-high-boiling-point component, e.g., a stripped photoresist-rich stream, among the components of the raw material $F_{1-1}$ may be discharged from the column bottom zone 130 of the dividing wall column 100. A portion of the discharged column bottom stream $F_{1-3}$ is refluxed into the column bottom zone 130 of the dividing wall column 100 via the reboiler 103 and the remaining portion may be stored as a product. In addition, the product stream $F_{1-4}$ including middle-boiling-point components, e.g., a 2-(2-aminoethoxy)-1-ethanol (AEE), diethylene glycol monobutylether (BDG), N-methyl pyrrolidone (NMP) and dimethylacetamide (DMAc)-rich stream, among the components of the raw material $F_{1-1}$ may be discharged from the product discharge zone 122 of the dividing wall column 100.

In another embodiment, to separate the raw material $F_{1-1}$ including components having low, middle, or high boiling points, the raw material $F_{1-1}$ of the waste stripper solution including an aqueous stripper and a stripped photoresist may be introduced into the feed supply zone 121 of the dividing wall column 100 as illustrated in FIG. 1. The raw material $F_{1-1}$ introduced into the feed supply zone 121 may be separately discharged as the column bottom stream $F_{1-3}$ including the stripped photoresist resin, the product stream $F_{1-4}$ including the organic amine compound, the protic glycol ether based organic solvent, the aprotic polar solvent, and water, and the column overhead stream $F_{1-2}$ including a material having a boiling point of less than 100° C. at atmospheric pressure. In an embodiment, the organic amine compound included in the product stream $F_{1-4}$ may be, e.g., 2-(2-aminoethoxy)-1-ethanol (AEE) and/or monoethanolamine (MEA); the protic glycol ether based organic solvent may be, e.g., diethyleneglycolmonoethylether (EDG) and/or ethyleneglycol (EG); and the aprotic polar solvent may be, e.g., N-methyl pyrrolidone (NMP). In addition, the material having a boiling point of less than 100° C. at atmospheric pressure included in the column overhead stream $F_{1-2}$ may include, for example, methanol.

In an embodiment, when the raw material $F_{1-1}$ including methanol as a $_{light}$ component; 2-(2-aminoethoxy)-1-ethanol (AEE), monoethanolamine (MEA), diethyleneglycolmonoethylether (EDG), ethyleneglycol (EG), N-methyl pyrrolidone (NMP), and water as middle-boiling-point components; and a photoresist resin as a high-boiling-point component is introduced into the feed supply zone 121 of the dividing wall column 100, the column overhead stream $F_{1-2}$ as a stream including a relatively $_{light}$ component, e.g., methanol-rich stream, among the components of the raw material $F_{1-1}$ may be discharged from the column top zone 110 of the dividing wall column 100. A portion of the discharged column overhead stream $F_{1-2}$ is refluxed into the column top zone 110 of the dividing wall column 100 via the condenser 102 and the remaining portion thereof may be stored as a product. Meanwhile, the column bottom stream $F_{1-3}$ including a relatively-high-boiling-point component, e.g., a stripped photoresist-rich stream, among the components of the raw material $F_{1-1}$ may be discharged from the column bottom zone 130 of the dividing wall column 100.

A portion of the discharged column bottom stream $F_{1-3}$ is refluxed into the column bottom zone 130 of the dividing wall column 100 via the reboiler 103 and the remaining portion may be stored as a product. In addition, the product stream $F_{1-4}$ including middle-boiling-point components, e.g., a 2-(2-aminoethoxy)-1-ethanol (AEE), monoethanolamine (MEA), diethyleneglycolmonoethylether (EDG), ethyleneglycol (EG), N-methyl pyrrolidone (NMP) and water-rich stream, among the components of the raw material F1-1 may be discharged from the product discharge zone 122 of the dividing wall column 100.

The column bottom stream $F_{1-3}$ discharged from the column bottom zone 130 of the dividing wall column 100 passes through the reboiler 103, and a portion or the entirety of the column bottom stream $F_{1-3}$ via the reboiler 103 may be introduced into the column bottom zone 130 and refluxed into the dividing wall column 100, or may be stored as a product. In addition, the column overhead stream $F_{1-2}$ discharged from the column top zone 110 of the dividing wall column 100 passes through the condenser 102. A portion or the entirety of the column overhead stream $F_{1-2}$ via the condenser 102 may be introduced into the column top zone 110 and refluxed into the dividing wall column 100, or may be stored as a product. In addition, the product stream $F_{1-4}$ discharged from the product discharge zone 122 of the dividing wall column 100 may be stored as a product.

The present application also relates to a distillation method of separating a waste stripper solution.

An exemplary distillation method of the present application may be performed using the aforementioned distillation device. Accordingly, contents the same as the aforementioned descriptions regarding the distillation device are omitted.

An embodiment of the distillation method according to the present application includes a step of introducing the raw material $F_{1-1}$ of a waste stripper solution and a step of separating the raw material $F_{1-1}$ of the waste stripper solution.

The step of introducing the raw material $F_{1-1}$ of the waste stripper solution is a step in which the raw material $F_{1-1}$ of a waste stripper solution including a stripper and a stripped photoresist is introduced into the dividing wall column 100. More particularly, the distillation device of the present application includes, e.g., the dividing wall 101, in the interior thereof, the interior of the distillation device is divided into zones not including the dividing wall 101 (i.e., the column top zone 110 and the column bottom zone 130), and the dividing wall zone 120 including the dividing wall 101 (i.e., the feed supply zone 121 and the product discharge zone 122 divided by the dividing wall 101). In an embodiment, the raw material $F_{1-1}$ of the waste stripper solution is introduced into the feed supply zone 121 of the dividing wall column.

The step of separating the raw material $F_{1-1}$ is a step in which the raw material $F_{1-1}$ introduced into the feed supply zone 121 is respectively separated in and respectively discharged from the column top zone 110, the product discharge zone 122 and the column bottom zone 130 of the dividing wall column 100 and. More particularly, in the step, the stripper is separated in the product discharge zone 122 of the dividing wall column 100, and the stripped photoresist is separated in the column bottom zone 130 of the dividing wall column 100.

In an embodiment, the raw material $F_{1-1}$ of the waste stripper solution introduced into the dividing wall column 100 may include a stripper and a stripped photoresist. Here, the stripper may be a non-aqueous or aqueous stripper. The raw material $F_{1-1}$ of the waste stripper solution is described above and thus description thereof is omitted.

For example, the step of separating the raw material $F_{1-1}$ may include discharging a stream having a relatively low boiling point among the raw material $F_{1-1}$ from the column top zone 110 of the dividing wall column 100 through the column overhead stream $F_{1-2}$, discharging a stream having a relatively high boiling point from the column bottom zone 130 of the dividing wall column 100 through the column bottom stream $F_{1-3}$, and a stream having a relatively middle boiling point from the product discharge zone 122 of the dividing wall column 100.

In an embodiment, when the stripper is a non-aqueous stripper including water, an organic amine compound, an organic solvent, and a stripped photoresist resin, the step of separating the raw material $F_{1-1}$ may include a step of separating the raw material $F_{1-1}$ into the column bottom stream $F_{1-3}$ including the stripped photoresist resin, the product stream $F_{1-4}$ including the organic amine compound and organic solvent, and the column overhead stream $F_{1-2}$ including water and/or a material having a boiling point of less than 100° C. at atmospheric pressure and a step of discharging the same.

In this case, the step of separating the raw material $F_{1-1}$ may include controlling the temperature of the column top zone 110 of the dividing wall column 100 to within a range of lower and upper temperatures respectively calculated according to Equations 1 and 2 below. Detailed description regarding this has been made and thus is omitted.

$$P=0.00126 \times T_{top,lower}^3 - 0.07051 \times T_{top,lower}^2 + 3.17767 \times T_{top,lower} - 15.01040 \quad \text{[Equation 1]}$$

$$P=0.00150 \times T_{top,upper}^3 - 0.18493 \times T_{top,upper}^2 + 9.56742 \times T_{top,lower} - 176.07273 \quad \text{[Equation 2]}$$

In Equations 1 and 2, $T_{top,lower}$ represents a lower temperature of the column top zone, $T_{top,upper}$ represent an upper temperature of the column top zone, and P represents the pressure of the column top zone. Here, the pressure is 20 mmHg to 300 mmHg In addition, when the stripper is an aqueous stripper including water, an organic amine compound, an organic solvent, and a stripped photoresist resin, the step of separating the raw material $F_{1-1}$ may include a step of separating the raw material $F_{1-1}$ into the column bottom stream $F_{1-3}$ including the stripped photoresist resin, the product stream $F_{1-4}$ including the organic amine compound, the organic solvent, and water, and the column overhead stream $F_{1-2}$ including a material having a boiling point of less than 100° C. at atmospheric pressure and a step of discharging the same. Description regarding the step of separating the raw material $F_{1-1}$ is the same as that of the dividing wall column 100, which has been made above, and thus is omitted.

In this case, the step of separating the raw material $F_{1-1}$ may include controlling the temperature of the column top zone 110 of the dividing wall column 100 to within a range of lower and upper temperatures calculated by Equations 3 and 4 below. Detailed description regarding this has been made above, and thus is omitted.

$$P=0.00177 \times T_{top,lower}^3 - 0.01645 \times T_{top,lower}^2 + 2.13532 \times T_{top,lower} - 12.36272 \quad \text{[Equation 3]}$$

$$P=0.00144 \times T_{top,lower}^3 - 0.10028 \times T_{top,lower}^2 + 4.27752 \times T_{top,lower} - 44.49051 \quad \text{[Equation 4]}$$

In Equations 3 and 4, $T_{top,lower}$ represents a lower temperature of the column top zone, $T_{top,upper}$ represents an upper temperature of the column top zone, and P represents the pressure of the column top zone. Here, the pressure is 20 mmHg to 300 mmHg Detailed descriptions regarding the pressures, temperatures and reflux ratios of the column overhead stream $F_{1-2}$ discharged from the column top zone 110 of the dividing wall column 100, the column bottom stream $F_{1-3}$ discharged from the column bottom zone 130, and the product stream $F_{1-4}$ discharged from the product discharge zone 122 are the same as those of the dividing wall column 100, which have been made above, and thus are omitted.

Each of the steps is independently, organically connected to each other and thus the respective step is not clearly divided according to a time sequence. Accordingly, the respective step may be sequentially or independently carried out. In addition, a process commonly performed in a technical field of the present invention may be further included before or after the respective step. Therefore, the manufacturing method of the present invention is not limited only to the steps.

By using the distillation device of the present application and the distillation method using the distillation device, energy consumption may be reduced and the size of a distillation device for purifying the raw material may be minimized, thereby increasing the economic feasibility of a process.

Advantageous Effects

By using the distillation device of the present application, energy consumed in a purification process of a waste stripper solution including a stripper and a stripped photoresist resin used in a stripping process of a photoresist can be minimized and the installation cost of the distillation device can be reduced compared to the case in which dual distillation columns are used, thereby increasing the economic feasibility of a process.

DESCRIPTION OF SYMBOLS $F_{1-1}$: RAW MATERIAL
$F_{1-2}$: COLUMN OVERHEAD STREAM
$F_{1-3}$: COLUMN BOTTOM STREAM
$F_{1-4}$: PRODUCT STREAM
100: DIVIDING WALL COLUMN
101: DIVIDING WALL
102: CONDENSER
103: REBOILER
110: COLUMN TOP ZONE
120: DIVIDING WALL ZONE
121: FEED SUPPLY ZONE
122: PRODUCT DISCHARGE ZONE
130: COLUMN BOTTOM ZONE

BEST MODE

Hereinafter, the present invention will be described in detail with reference to the following examples according to the present invention and comparative examples not according to the present invention. However, the following examples and comparative examples are not provided to limit the scope of the present invention and those skilled in the art will appreciate that various modifications, additions and substitutions are possible, without departing from the scope and spirit of the invention.

Example 1

A non-aqueous stripper including an organic amine compound, a protic glycol ether based organic solvent, and an aprotic polar solvent; and a waste stripper solution including a stripped photoresist and water were separated by means of a distillation device illustrated in FIG. 1. In particular, a 25° C. raw material including 47% by weight of dimethylacetamide (DMAc), 14% by weight of N-methylpyrrolidone (NMP), 5% by weight of 2-(2-aminoethoxy)-1-ethanol (AEE), 19% by weight of diethylene glycol monobutylether (BDG), 1% by weight of a photoresist, and 14% by weight of water was introduced into a feed supply zone that was located at an $11^{th}$ plate of a dividing wall column having a theoretical number of plates of 24 at a flow rate of 1500 kg/hr, thereby performing a separation process. The introduced raw material was discharged through a stream of each of a column top zone, a product sidedraw zone, and a column bottom zone of the dividing wall column.

Here, a portion of the column top stream discharged from the column top zone of the dividing wall column was refluxed into the dividing wall column via a condenser, and a portion of the remainder of the column top stream was separated into a product containing water at a flow rate of 210 kg/hr. In addition, a portion of a column bottom stream discharged from a column bottom zone was returned to the dividing wall column via a reboiler, and a portion of the remainder of column bottom stream was stored as a product including the stripped photoresist. Meanwhile, a product stream discharged from the product discharge zone was discharged from the product discharge zone of the dividing wall column, separated, and stored as a product including dimethylacetamide (DMAc), N-methylpyrrolidone (NMP), 2-(2-aminoethoxy)-1-ethanol (AEE), and diethylene glycol monobutylether (BDG). The content of water in the product stream was 1 ppm and the content of a high boiling point impurity, a photoresist, in the column bottom stream was 4 ppb. In this case, an operation pressure of the column top zone of the dividing wall column was adjusted to 200 mmHg, an operation temperature thereof was adjusted to 65 to 70° C. In addition, an operation pressure of the column bottom zone was adjusted to 260 to 270 mmHg, and an operation temperature thereof was adjusted to 190 to 195° C. In addition, an operation pressure of the product sidedraw zone was adjusted to 230 to 240 mmHg and an operation temperature thereof was adjusted to 135 to 140° C. A reflux ratio of the column top zone of the dividing wall column was set to 2 to 2.5 and a boilup ratio of the column bottom zone thereof was set to 57.2 to 57.7.

Example 2

A waste stripper solution including a non-aqueous stripper and a stripped photoresist resin was separated in the same manner as in Example 1, except that an operation pressure and operation temperature of the column top zone of the dividing wall column were respectively adjusted to 100 mmHg and 50 to 55° C., an operation pressure and operation temperature of the column bottom zone thereof were respectively adjusted to 160 to 170 mmHg and 175 to 180° C., and an operation pressure and operation temperature of the product discharge zone thereof were respectively adjusted to 130 to 140 mmHg and 120 to 125° C. In this case, a reflux ratio of the column top zone of the dividing wall column was set to 2 to 2.5, a boilup ratio of the column bottom zone was set to 57.2 to 57.5, the content of water in the product stream was 1 ppm, and the content of a high boiling point impurity, a photoresist, in the column bottom stream was 2 ppb.

Example 3

An aqueous stripper including an organic amine compound, a protic glycol ether based organic solvent, an aprotic polar solvent, and water; and a waste stripper solution including a stripped photoresist were separated by means of the distillation device illustrated in FIG. 1. In particular, a 25° C. raw material including 7% by weight of monoethanolamine (MEA), 20% by weight of ethyleneglycol (EG), 45% by weight of diethyleneglycolmonoethylether (EDG), 5% by weight of N-methylpyrrolidone (NMP), 1% by weight of a photoresist, 2% by weight of methanol, and 20% by weight of water was introduced into a feed supply zone of a dividing wall column having a theoretical number of plates of 24 at a flow rate of 1500 kg/hr, thereby performing a separation process. The introduced raw material was discharged through a stream of each of a column top zone, a product sidedraw zone, and a column bottom zone of the dividing wall column.

Here, a portion of the column top stream discharged from the column top zone of the dividing wall column was refluxed into the dividing wall column via a condenser, and a portion of the remainder of the column top stream was separated into a product containing methanol at a flow rate of 60 kg/hr. In addition, a portion of a column bottom stream discharged from a column bottom zone was returned to the dividing wall column via a reboiler, and a portion of the remainder of column bottom stream was stored as a product including the stripped photoresist. Meanwhile, a product stream discharged from the product sidedraw zone was discharged from the product discharge zone of the dividing wall column, separated, and stored as a product including monoethanolamine (MEA), ethyleneglycol (EG), diethyleneglycolmonoethylether (EDG), N-methylpyrrolidone (NMP), and water. The content of a low boiling point impurity, methanol, in the product stream was 5 ppm and the content of a high boiling point impurity, a photoresist, in the column bottom stream was 1 ppb. In this case, an operation pressure of the column top zone of the dividing wall column was adjusted to 250 mmHg, an operation temperature thereof was adjusted to 60 to 65° C. In addition, an operation pressure of the column bottom zone was adjusted to 310 to 320 mmHg, and an operation temperature thereof was adjusted to 185 to 190° C. In addition, an operation pressure of the product sidedraw zone was adjusted to 285 to 290 mmHg and an operation temperature thereof was adjusted to 85 to 90° C. A reflux ratio of the column top zone of the dividing wall column was set to 33 to 33.5 and a boilup ratio of the column bottom zone thereof was set to 228.5 to 229.

Example 4

A waste stripper solution including an aqueous stripper and a stripped photoresist resin was separated in the same manner as in Example 3, except that an operation pressure and operation temperature of the column top zone of the dividing wall column were respectively adjusted to 100 mmHg and 40 to 45° C., an operation pressure and operation temperature of the column bottom zone thereof were respectively adjusted to 160 to 170 mmHg and 160 to 165° C., and an operation pressure and operation temperature of the product discharge zone thereof were respectively adjusted to 130 to 140 mmHg and 70 to 75° C. In this case, a reflux ratio of the column top zone of the dividing wall column was set to 31 to 31.5, a boilup ratio of the column bottom zone was set to 207 to 207.5, the content of a low boiling point impurity, methanol, in the product stream was 1 ppm, and the content of a high boiling point impurity, a photoresist, in the column bottom stream was less than a measurable limit value.

Comparative Example 1

Figure 2:
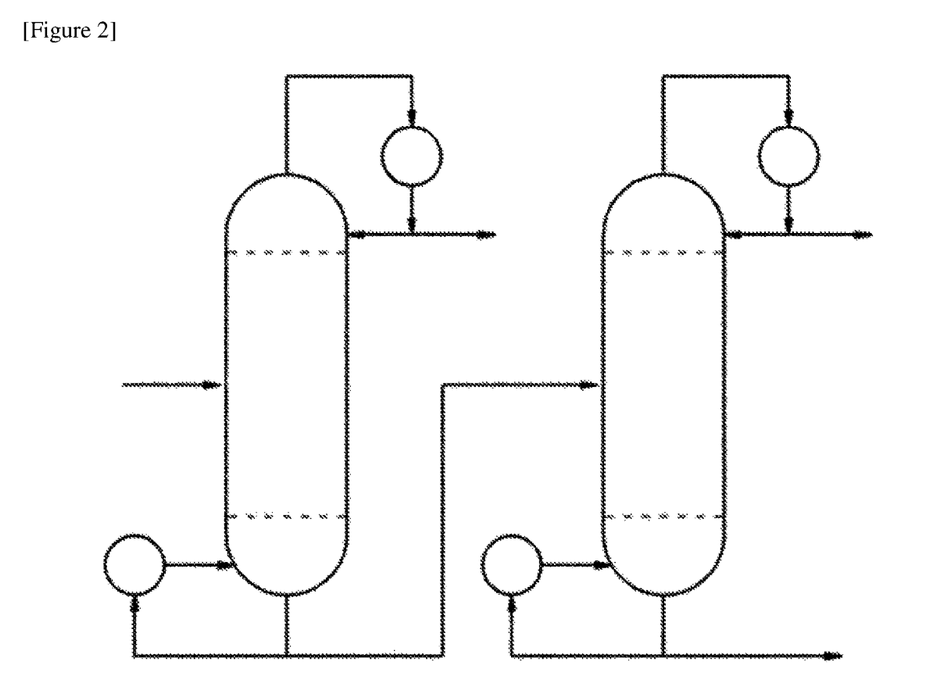
FIG. 2 schematically illustrates distillation devices used in Comparative Examples 1 and 3.

As illustrated in FIG. 2, a non-aqueous stripper including an organic amine compound, a protic glycol ether based organic solvent, and an aprotic polar solvent; and a waste stripper solution including a stripped photoresist resin were separated by means of a distillation device in which two distillation columns were connected. In particular, a 25° C. raw material including 47% by weight of dimethylacetamide (DMAc), 14% by weight of N-methylpyrrolidone (NMP), 5% by weight of 2-(2-aminoethoxy)-1-ethanol (AEE), 19% by weight of diethylene glycol monobutylether (BDG), 1% by weight of a photoresist, and 14% by weight of water was introduced into a first distillation column at a flow rate of 1500 kg/hr and thus a separation process was carried out.

A portion of a low-boiling-point stream discharged from a column top zone of the first distillation column was refluxed into the first distillation column via a condenser and the remainder of the low-boiling-point stream was stored as a product at a flow rate of 210 kg/hr. In addition, a portion of a stream discharged from a column bottom zone of the first distillation column was refluxed into the column bottom zone of the first distillation column using a reboiler and the remainder thereof was introduced into a second distillation column at a flow rate of 1290 kg/hr. An middle-boiling-point stream discharged from the column top zone of the second distillation column was condensed by a condenser. A portion of the condensed middle-boiling-point stream was refluxed into the column top zone of the second distillation column and the remainder thereof was separated as a product at a flow rate of 1227 kg/hr. A high-boiling-point stream discharged from a column bottom zone of the second distillation column was refluxed into the column bottom zone of the second distillation column via a reboiler and the remainder thereof was separated as a product at a flow rate of 63 kg/hr. In this case, the temperature of the column top zone of the first distillation column was adjusted to 70 to 75° C. and the pressure thereof was adjusted to 250 mmHg. In addition, the temperature of the column bottom zone of the first distillation column was adjusted to 140 to 145° C. and the pressure thereof was adjusted to 300 to 310 mmHg. The pressure of the column top zone of the second distillation column adjusted to 120 to 125° C. and the pressure thereof was adjusted to 65 mmHg. In addition, the temperature of the column bottom zone of the second distillation column was adjusted to 165 to 170° C. and the pressure thereof was adjusted to 130 to 140 mmHg. In addition, a reflux ratio of the column top zone of the first distillation column was set to 1.5 to 2.0 and the reflux ratio of the column top zone of the second distillation column was set to 0.01 to 0.5. The content of water in a product stream was 1 ppm and the content of a high boiling point impurity, a photoresist, in the column bottom stream was 2 ppb.

Comparative Example 2

A waste stripper solution including a non-aqueous stripper and a stripped photoresist resin was separated in the same manner as in Example 1, except that an operation pressure and operation temperature of the column top zone of the dividing wall column were respectively adjusted to 760 mmHg and 100 to 105° C., an operation pressure and operation temperature of the column bottom zone thereof respectively adjusted to 820 to 830 mmHg and 240 to 245° C., and an operation pressure and operation temperature of the product discharge zone were respectively adjusted to 790 to 800 mmHg and 180 to 185° C. In this case, a reflux ratio of the column top zone of the dividing wall column was set to 2.5 to 3, a boilup ratio of the column bottom zone was set to 77.5 to 78, the content of water in the product stream was 1 ppm, and the content of a high boiling point impurity, a photoresist, in the column bottom stream was 18 ppb.

Comparative Example 3

As illustrated in FIG. 2, an aqueous stripper including an organic amine compound, a protic glycol ether based organic solvent, an aprotic polar solvent, and water; and a waste stripper solution including a stripped photoresist resin were separated by means of a distillation device in which two distillation columns were connected. In particular, a 25° C. raw material including 7% by weight of monoethanolamine (MEA), 20% by weight of ethyleneglycol (EG), 45% by weight of diethyleneglycolmonoethylether (EDG), 5% by weight of N-methylpyrrolidone (NMP), 1% by weight of a photoresist, 2% by weight of methanol, and 20% by weight of water was introduced into the first distillation column at a flow rate of 1500 kg/hr and thus a separation process was carried out.

A portion of a low-boiling-point stream discharged from a column top zone of the first distillation column was refluxed into the first distillation column via a condenser and a portion of the remainder of the low-boiling-point stream was stored as a product at a flow rate of 20 kg/hr. In addition, a portion of a stream discharged from a column bottom zone of the first distillation column was refluxed into the column bottom zone of the first distillation column using a reboiler and the remainder thereof was introduced into a second distillation column at a flow rate of 1380 kg/hr. An middle-boiling-point stream discharged from the column top zone of the second distillation column was condensed by a condenser. A portion of the condensed middle-boiling-point stream was refluxed into the column top zone of the second distillation column and the remainder thereof was separated as a product at a flow rate of 1344 kg/hr. A high-boiling-point stream discharged from a column bottom zone of the second distillation column was refluxed into the column bottom zone of the second distillation column via a reboiler and the remainder thereof was separated as a product at a flow rate of 36 kg/hr. In this case, the temperature of the column top zone of the first distillation column was adjusted to 90 to 95° C. and the pressure thereof was adjusted to 760 mmHg. In addition, the temperature of the column bottom zone of the first distillation column was adjusted to 100 to 105° C. and the pressure thereof was adjusted to 810 to 820 mmHg. The pressure of the column top zone of the second distillation column was adjusted to 110 to 115° C. and the pressure thereof was adjusted to 65 mmHg. In addition, the temperature of the column bottom zone of the second distillation column was adjusted to 155 to 160° C. and the pressure thereof was adjusted to 130 to 140 mmHg. In addition, a reflux ratio of the column top zone of the first distillation column was set to 15.5 to 16 and the reflux ratio of the column top zone of the second distillation column was set to 0.01 to 0.5. The content of a low boiling point impurity, methanol, in a product stream was 5 ppm and the content of a high boiling point impurity, a photoresist, in the column bottom stream was 7 ppb.

Comparative Example 4

A waste stripper solution including an aqueous stripper and a stripped photoresist resin was separated in the same manner as in Example 3, except that an operation pressure and operation temperature of the column top zone of the dividing wall column were respectively adjusted to 760 mmHg and 85 to 90° C., an operation pressure and operation temperature of the column bottom zone thereof respectively adjusted to 820 to 830 mmHg and 220 to 225° C., and an operation pressure and operation temperature of the product discharge zone were respectively adjusted to 790 to 800 mmHg and 115 to 120° C. In this case, a reflux ratio of the column top zone of the dividing wall column was set to 43 to 43.5, a boilup ratio of the column bottom zone was set to 303.5 to 304, the content of a low boiling point impurity, methanol, in the product stream was 5 ppm, and the content of a high boiling point impurity, a photoresist, in the column bottom stream was 7 ppb.

The raw material including a non-aqueous stripper and a stripped photoresist resin was purified in accordance with each of Examples 1 and 2 and Comparative Examples 1 and 2, and then the purity of the non-aqueous stripper separated into a product discharge stream and an energy consumption amount of the reboiler were measured and summarized in Table 1 below.

TABLE 1

|  | Example 1 | Example 2 | Comparative Example 1 | Comparative Example 2 |
|---|---|---|---|---|
| Content of water in product stream (ppm) | 1 ppm | 1 ppm | 1 ppm | 1 ppm |
| Energy reduction rate (%) | 16 | 20 | — | 1 |
| Recovery rate of product (stripper) (%) | 96.5 | 96.5 | 96.5 | 96.5 |

The raw material including an aqueous stripper and a stripped photoresist resin was purified in accordance with each of Examples 3 and 4 and Comparative Examples 3 and 4, and then the purity of the aqueous stripper separated into a product discharge stream and an energy consumption amount of the reboiler were measured and summarized in Table 1 below.

TABLE 2

|  | Example 3 | Example 4 | Comparative Example 3 | Comparative Example 4 |
|---|---|---|---|---|
| Content of water in product stream (ppm) | 5 ppm | 5 ppm | 5 ppm | 5 ppm |
| Energy reduction rate (%) | 30 | 34 | — | 11 |
| Recovery rate of product (stripper) (%) | 96.5 | 96.5 | 92.4 | 96.5 |

As shown in Tables 1 and 2, it can be confirmed that the energy use amount of the reboiler used in the purification process using the distillation device of Examples 1 to 4 according to the present application is greatly decreased, compared to that of the reboiler used in the purification process using each of the distillation devices of Comparative Example 1 to 4. That is, when a waste stripper and a stripped photoresist resin are separated by means of the distillation device of the examples according to the present application, an energy reduction effect of up to 34%, compared to Comparative Examples 1 and 3, can be obtained.

In addition, it can be confirmed that, in the purification process using the distillation device according to Comparative Example 3, the recovery rate of a product (stripper) is lower than those in the purification processes using the distillation device of Examples 3 and 4. That is, when the aqueous stripper and the stripped photoresist resin are separated by means of the distillation device of the examples of the present application, superior effects in terms of a recovery rate of a product (stripper), as well as energy reduction, can be obtained.

Furthermore, it can be confirmed that, as in Examples 1 to 4 of the present application and Comparative Examples 2 and 4, a process control condition should be adjusted into a specific range considering that the stripper is non-aqueous stripper or an aqueous stripper, although a waste stripper solution is separated by means of the dividing wall column and, through the adjustment, a high-purity aqueous or non-aqueous stripper can be obtained at high efficiency.

The invention claimed is:

1. A distillation method, comprising a distillation device, comprising a reboiler, and a distillation column, a dividing wall being provided in an interior of the distillation column:
   wherein an interior of the distillation column is divided into a column top zone; a column bottom zone; and a dividing wall zone that is present between the column top zone and the column bottom zone and contacts the column top zone and the column bottom zone, the dividing wall is located in the dividing wall zone, and the dividing wall zone is divided into a feed supply zone and a product discharge zone divided by the dividing wall,
   a raw material of a waste stripper solution comprising a stripper and a stripped photoresist resin is introduced into a feed supply zone and the introduced raw material is respectively separated into and discharged as a product stream, a column bottom stream, and a column top stream,
   the column bottom stream is discharged from the column bottom zone and a portion of the column bottom stream is refluxed into the column bottom zone via the reboiler,
   the column top stream is discharged from the column top zone and a portion of the column top stream is refluxed into the column top zone via the condenser, and
   the product stream is discharged from the product discharge zone,
   wherein the stripper is a non-aqueous stripper and the temperature of the column top zone is adjusted to within a range of lower and upper temperatures respectively calculated according to Equations 1 and 2 below:

$$P=0.00126 \times T_{top,lower}^3 - 0.07051 \times T_{top,lower}^2 + 3.17767 \times T_{top,lower} - 15.01040 \quad \text{[Equation 1]}$$

$$P=0.00150 \times T_{top,upper}^3 - 0.18493 \times T_{top,upper}^2 + 9.56742 \times T_{top,lower} - 176.07273 \quad \text{[Equation 2]}$$

wherein $T_{top,lower}$ represents a lower temperature of the column top zone, $T_{top,upper}$ represent an upper temperature of the column top zone, and P represents the pressure of the column top zone.

2. The distillation device method according to claim 1, wherein the column bottom stream comprises a stripped photoresist resin.

3. The distillation method according to claim 1, wherein the column top stream comprises one or more selected from the group consisting of water and materials having a boiling point of less than 100° C. at atmospheric pressure.

4. The distillation method according to claim 1, wherein the product stream comprises a prone organic solvent, an aprotic polar solvent, and an organic amine compound.

5. The distillation method according to claim 1, wherein a temperature of the column bottom zone is 100° C. to 250° C.

6. The distillation method according to claim 1, wherein a temperature of the column top zone is 14° C. to 92° C.

7. The distillation method according to claim 1, wherein a pressure of the column bottom zone is 50 to 400 mmHg.

8. The distillation method according to claim 1, wherein a pressure of the column top zone is 20 to 300 mmHg.

9. A distillation method using a distillation device, comprising a condenser, a reboiler, and a distillation column, a dividing wall being provided in an interior of the distillation column,
   wherein an interior of the distillation column is divided into a column top zone; a column bottom zone; and a dividing wall zone that is present between the column top zone and the column bottom zone and contacts the column top zone and the column bottom zone, the dividing wall is located in the dividing wall zone, and the dividing wall zone is divided into a feed supply zone and a product discharge zone divided by the dividing wall,
   a raw material of a waste stripper solution comprising a stripper and a stripped photoresist resin is introduced into the feed supply zone and the introduced raw material is respectively separated into and discharged as a product stream, a column bottom stream, and a column top stream,
   the column bottom stream is discharged from the column bottom zone and a portion of the column bottom stream is refluxed into the column bottom zone via the reboiler,
   the column top stream is discharged from the column top zone and a portion of the column top stream is refluxed into the column top zone via the condenser, and
   the product stream is discharged from the product discharge zone,
   wherein the stripper is an aqueous stripper and a temperature of the column top zone is adjusted to within a range of lower and upper temperatures respectively calculated according to Equations 3 and 4 below:

$$P=0.00177 \times T_{top,lower}^3 - 0.01645 \times T_{top,lower}^2 + 2.13532 \times T_{top,lower} - 12.36272 \quad \text{[Equation 3]}$$

$$P=0.00144 \times T_{top,lower}^3 - 0.10028 \times T_{top,lower}^2 + 4.27752 \times T_{top,lower} - 44.49051 \quad \text{[Equation 4]}$$

wherein $T_{top,lower}$ represents a lower temperature of the column top zone, $T_{top,lower}$ represent an upper temperature of the column top zone, and P represents the pressure of the column top zone.

10. The distillation method according, to claim 9, wherein the column bottom stream comprises a stripped photoresist resin.

11. The distillation method according to claim 9, wherein the column top stream comprises a material having a boiling point of less than 100° C. at atmospheric pressure.

12. The distillation method according to claim 9, wherein the product stream comprises water, a protic organic solvent, an aprotic polar solvent, and an organic amine compound.

13. The distillation method according to claim 9, wherein a temperature of the column bottom zone is 150° C. to 300° C.

14. The distillation method according to claim 9, Wherein a temperature of the column top zone is 4° C. to 74° C.

15. The distillation method according to claim 9, wherein a pressure of the column bottom zone is 50 to 400 mmHg.

\* \* \* \* \*